(12) United States Patent
Morris

(10) Patent No.: US 6,486,408 B1
(45) Date of Patent: Nov. 26, 2002

(54) FLEXIBLE CIRCUIT USING DISCRETE WIRING

(75) Inventor: Terrel L. Morris, Garland, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/702,461

(22) Filed: Oct. 31, 2000

(51) Int. Cl.⁷ .............................. H05K 1/00; H05K 1/11
(52) U.S. Cl. ..................... 174/254; 174/251; 174/261; 174/262; 174/266; 361/749; 361/803
(58) Field of Search .................... 174/265, 266, 174/263, 262, 254, 264, 261, 255, 35 R, 251, 117 F, 117 FF; 361/756, 750, 749, 794, 803, 808, 809; 439/67, 77; 29/840, 850, 852, 843

(56) References Cited

U.S. PATENT DOCUMENTS

| | | | | |
|---|---|---|---|---|
| 3,674,914 A | * | 7/1972 | Burr | 174/261 |
| 4,450,623 A | * | 5/1984 | Burr | 29/850 |
| 4,662,963 A | * | 5/1987 | Varker | 156/176 |
| 4,711,026 A | * | 12/1987 | Swiggett et al. | 29/850 |
| 4,859,807 A | * | 8/1989 | Swiggett et al. | 174/259 |
| 5,699,613 A | * | 12/1997 | Chong et al. | 29/852 |
| 6,083,340 A | * | 7/2000 | Nomura et al. | 156/253 |
| 6,137,064 A | * | 10/2000 | Kiani et al. | 174/266 |
| 6,192,580 B1 | * | 2/2001 | Hayami | 29/846 |
| 6,252,779 B1 | * | 6/2001 | Pierson et al. | 361/774 |

\* cited by examiner

Primary Examiner—David L. Talbott
Assistant Examiner—I B Patel

(57) ABSTRACT

A system and method is described which provides for electrical signal transmission and a secure mechanical attachment in a flexible circuit assembly. The inventive mechanism combines the electrical features of discrete wiring with the mechanical features of etched pads connected to plated vias on flex circuits in order to achieve robustness in both the mechanical and electrical properties. A discrete wire is preferably securely bonded to a conductive pad which pad is then securely attached to a plated via. In this manner, the sequence of connections is made mechanically secure by either ultrasonically bonding or welding the discrete wire to the pad and employing the traditionally robust connection between the pad and the via. The arrangement achieves high quality electrical signal transmission by employing discrete wiring for signal transmission along any path of significant length.

21 Claims, 6 Drawing Sheets

FLEXIBLE CIRCUIT USING DISCRETE WIRING

TECHNICAL FIELD

This invention relates in general to electrical systems and in particular to reliable multiple path flexible circuit connections.

BACKGROUND

In many industrial systems, such as computer and telecommunications systems, there is a need for making a large number of electrical interconnections between a plurality of points of interest. It is generally desirable to achieve reliable connections (i.e. with low connection failure rates), with good electrical properties, and to be able to dispose such connections within a small area to address space limitations. Various prior art approaches have been attempted which experience limitations in one or more of the above-mentioned characteristics.

One prior art approach is that of Printed Wire Board (PWB) flex circuits. PWB flex circuits are generally easy to manufacture if they have wide lines and traces. However, such circuits are generally difficult to manufacture in volume when fine lines, high density, and/or tight impedance controls are required. Moreover, if tight impedance controls are required, yield losses are generally high in volume production due primarily to variations in the etch processes.

FIG. 1 is a section view of a strip line flex circuit 100 for high speed high density applications according to a prior art solution. Conductive traces 102 are shown with a dashed line. Ground planes 101 and 103 are shown running parallel to traces 102.

FIG. 2 is a top view of a center line cross section of the strip line flex circuit depicted in FIG. 1. A number 200 of parallel traces 201 may be seen in the top view of FIG. 2. Generally, the width of and spacing between traces 201 may be important features in determining electrical properties of the structure such as characteristic impedance, resistance, skin effect losses, and crosstalk between the traces.

FIG. 3 depicts sectional views 300 of four possible conductive trace geometries. The three columns separated by ideal spaces 306 are generally equivalent. Accordingly, the four trace geometries depicted in the rightmost column 301 will be discussed herein. Trace 302 generally represents an ideal trace geometry, which although highly desirable, is very difficult to achieve in a typical etch process. Trace 303 generally represents a desirable trace geometry which may be achieved with careful process control and with some yield loss. Trace 304 depicts a trace from which an excessive amount of conductive material, such as copper, has been removed. Trace 304 will generally experience excessive direct current (d.c.) resistance, increased skin effect losses, and undesirably high characteristic impedance. Element 305 depicts an under-etched trace. Such an under-etched trace will generally have excessive crosstalk and lower than ideal characteristic impedance.

High speed data cables have been employed to provide interconnection having superior electrical signal characteristics. However, the use of such cabling is generally more expensive to implement for transmission of a given set of signals than is printed wire board flex circuit. Moreover, connectors used to connect such data cables to a board generally provide lower signal density than do flex circuits. Furthermore, such cable connectors are commonly the cause of impedance mismatches, crosstalk, and skew.

In certain cases, multiple rigid PCBs (printed circuit boards) are used to establish electrical connections to system or subsystem units which are not on the same plane. As a result, multiple connectors may be introduced into the signal path, the addition of which generally degrades the quality of signal transmission. In addition, implementing a plurality of rigid PCBs generally adds to system cost, and takes up additional space.

FIG. 4A is a section view 400 of a via connected to a wire according to a prior art multiwire connection arrangement. Employing this arrangement, via 401 is generally formed onto the end of wire 402. Wire 402 may be coated with TEFLON® (polytetrafluoroethylene) for insulation purposes. In a connection employing the arrangement depicted in FIG. 4A, the available area for establishing a connection between wire 402 and via 401 is generally limited to the cross-sectional area of wire 402. Some additional contact area may become available where the polytetrafluoroethylene coating is etched back for a finite distance along wire 402 from the outside diameter of via 401. FIG. 4B is a top view of the same connection.

Although the embodiment depicted in FIGS. 4A and 4B generally provides the superior electrical properties of discrete wiring, the attachment of wire 402 to via 401 provides a weak mechanical connection between wire 402 and via 401 which is subject to failure if wire 402 is pulled or moved in any direction.

FIG. 5A is a section view 500 of a via 501 connected to a trace 502 in a printed circuit board arrangement. Employing this arrangement, a hole is drilled in a conductive pad connected to trace 502, and plating material added to create via 501. FIG. 5B is a top view of the connection depicted in FIG. 5A. This connection generally provides for a 360 degree connection between plating on via 501 and the copper of trace 502. This trace-via connection offers a more robust mechanical connection than the connection between the discrete wire and via depicted in FIG. 4. However, the trace-via connection of FIG. 5 is subject to the inconsistency in dimensional tolerance and electrical properties discussed in connection with FIG. 3.

FIG. 6 is a section view of a rigid circuit employing discrete wiring 602 between stripline shield layers 601 according to a prior art embodiment. FIG. 7 is a top view 700 of a center line cross section of wires 602 depicted in FIG. 6. Returning to FIG. 6, generally, the cross sectional area between stripline shield layers 601 is filled with rigid dielectric material 603, such as FR4 or G-Tec. The rigid circuit embodiment of FIG. 6 benefits from the advantageous electrical performance properties of discrete wiring. However, the embodiment employs the mechanically vulnerable wire to via connection discussed in connection with FIG. 4A.

Accordingly, it is a problem in the art that PWB flex circuits are difficult to manufacture in high volume and experience and high yield losses due to etch variations.

It is a further problem in the art that it is difficult to generate consistent trace geometries, resulting in inconsistent electrical properties for conductive traces.

It is a still further problem in the art that cables are generally more expensive to implement than flex circuits for the same number of signals.

It is a still further problem in the art that connectors used to attach cables to boards offer lower signal density than PWB flex circuits, and commonly cause impedance mismatches, crosstalk, and skew.

It is a still further problem in the art that the deployment of multiple PCBs cause added cost, take up additional space, and cause degraded performance because of the implementation of multiple connectors along individual signal paths.

It is a still further problem in the art that the connection of discrete wires to plated vias generally mechanically weak and subject to failure when the wire is pulled or moved.

SUMMARY OF THE INVENTION

The present invention is directed to a system and method which provides consistently high quality electrical performance characteristics in combination with robust mechanical attachment between conductors and electrical junctions. Preferably, discrete wires are connected to conductive pads employing either laser welded or ultrasonically bonded wire joints between the wires and pads. A plurality of layers having conductive pads may be combined to form a multiple layer flex circuit. Holes may then be drilled through the conductive pads in the traditional manner and then plated to create vias.

Preferably, electrically reliable discrete wires may be employed and still benefit from the mechanically robust connection created by the attachment of the pad to the via. Therefore, there is a generally a two stage connection which includes a connection between a wire, or other high performance conductor, to a conductive pad, and then a robust connection between the conductive pad and the via. A robust connection between the high quality conductor and the conductive pad may be formed by a number of mechanisms including but not limited to: laser welding and ultrasonic bonding. In this manner, a mechanically flexible circuit is provided which enjoys the high quality electrical performance of discrete wiring conduction and robust mechanical attachments between the wire, pad, and via, thereby enabling the circuit to be flexed at will without causing electrical connection failure.

In a preferred embodiment, a wire may be placed in contact with a conductive pad and then be ultrasonically bonded or welded thereto. Thereafter, a hole may be drilled in the conductive pad, and optionally, through a plurality of other layers in a flex circuit. The drilled hole may then be plated, thereby enabling the plating material to form a solid conductive and mechanical connection to the conductive pad. In this manner, the resulting connections are mechanically robust and benefit from the superior electrical properties of discrete wiring.

In a preferred embodiment, the system and method described above allow the creation of a high speed flexible circuit that combines high speed signal handling ability with robust mechanical connections. Since the bulk of the distance traveled by the signals is covered by a high quality conductor, such as, for instance, drawn wire, rather than etched trace, the conductor surface is preferably smooth, thereby enabling low loss skin effect parameters to be realized.

In a preferred embodiment, the wires may be individually formed, thereby enabling such wires to avoid the electrical performance problems associated with under-etch and over-etch to be avoided. Preferably, the wire to pad connection, which may be accomplished by welding or ultrasonic bonding, allows robust signal vias to be created employing standard drill and plating processes. Preferably, tighter impedance, resistance, and skin effect loss parameters may be realized employing a process which allows consistent manufacturing of a large number of circuits.

Therefore, it is an advantage of a preferred embodiment of the present invention that electrical performance characteristics of high quality conductors such as discrete wiring may be combined with robust mechanical characteristics in a flex circuit.

It is a further advantage of a preferred embodiment of the present invention that a flex circuit connection with robust mechanical and electrical characteristics may be reliably and consistently manufactured.

It is a still further advantage of a preferred embodiment of the present invention that impedance mismatch and other electrical performance problems associated with introduction of connectors into the signal path may be minimized.

It is a still further advantage of a preferred embodiment of the present invention that high quality conductors may be employed which do not suffer the yield losses associated with fine line etching of conductive traces.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
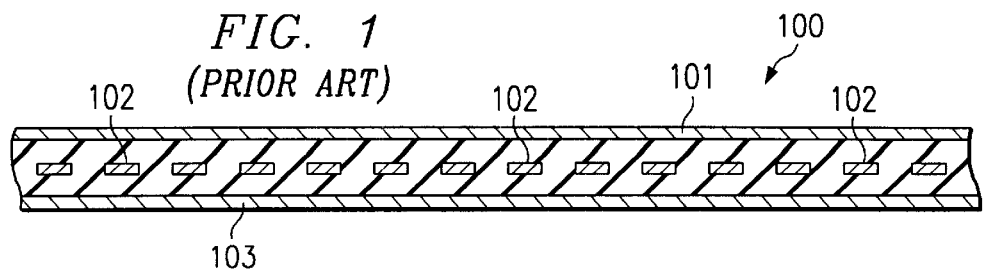
FIG. 1 is a section view of a strip line flex circuit for high speed high density applications according to a prior art solution.
Figure 2:
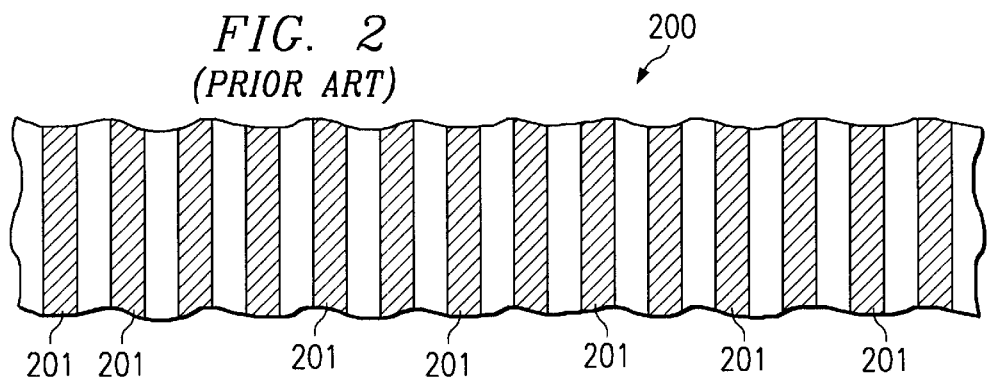
FIG. 2 is a top view of a center line cross section of the strip line flex circuit depicted in FIG. 1.
Figure 3:
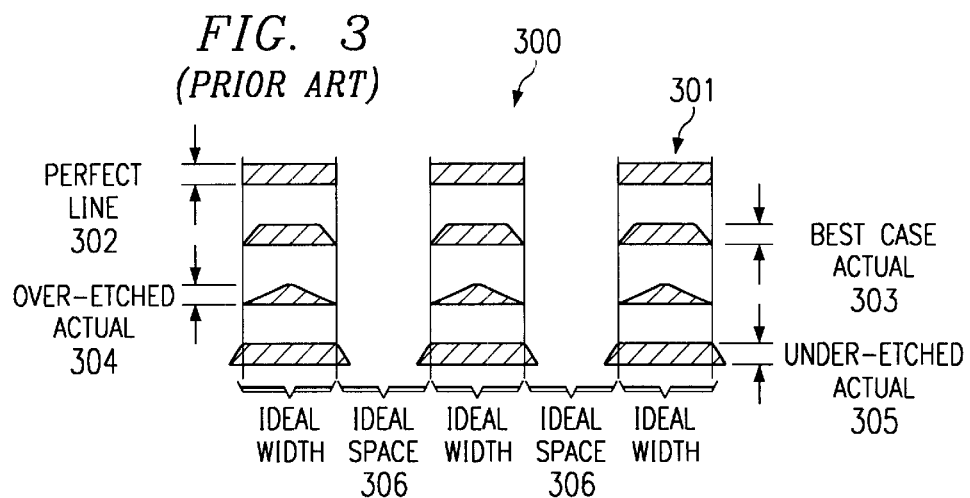
FIG. 3 depicts sectional views of four possible conductive trace geometries.
Figure 4A:
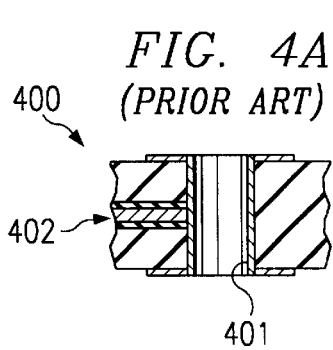
FIG. 4A is a section view of a via connected to a wire according to a prior art multiwire connection arrangement.
Figure 4B:
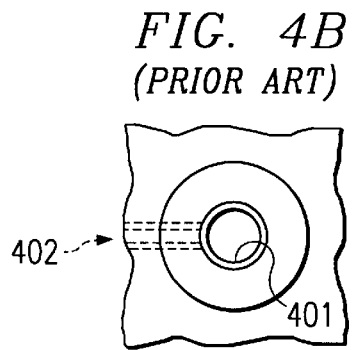
FIG. 4B is a top view of a via connected to a wire according to a prior art multiwire connection arrangement.
Figure 5A:
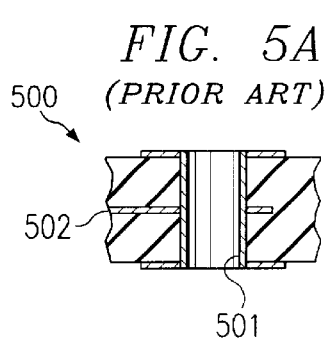
FIG. 5A is a section view of a via connected to a trace in a printed circuit board arrangement.
Figure 5B:
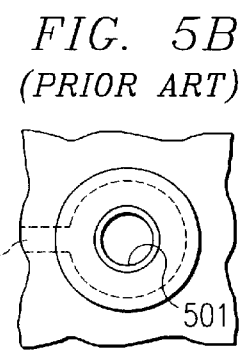
FIG. 5B is a top view of a via connected to a trace in a printed circuit board arrangement.
Figure 6:
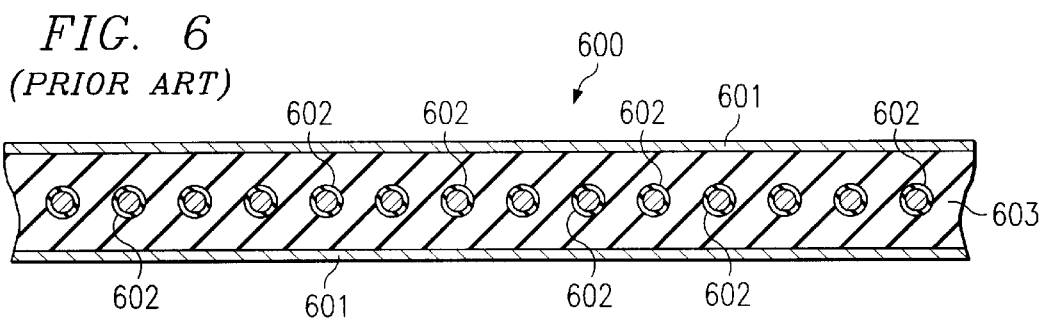
FIG. 6 is a section view of a rigid circuit employing discrete wiring between stripline shield layers.
Figure 7:
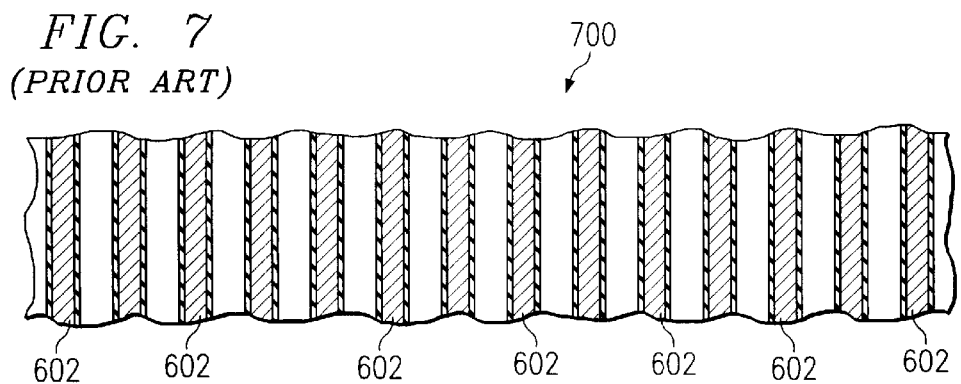
FIG. 7 is a top view of a center line cross section of the rigid circuit depicted in FIG. 6.
Figure 8:
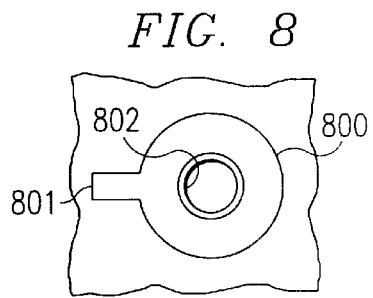
FIG. 8 is a top view of a printed circuit board pad.
Figure 9:
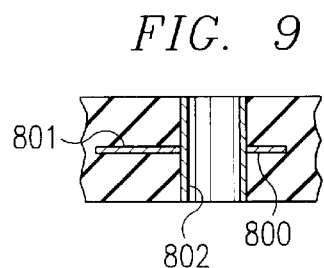
FIG. 9 is a side view of the printed circuit board pad depicted in FIG. 8.

FIG. 8 is a top view of a printed circuit board pad 800. FIG. 9 is a side view of the printed circuit board pad of FIG. 8.

Figure 10:
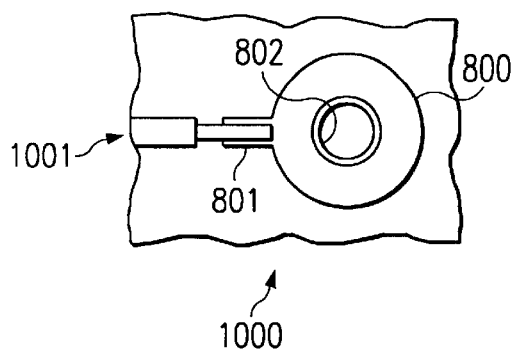
FIG. 10 is a top view of an attachment of a wire to the printed circuit board pad of FIG. 8 according to a preferred embodiment of the present invention.

FIG. 10 is a top view 1000 of an attachment of a wire 1001 to the printed circuit board pad 800 of FIG. 8 according to a preferred embodiment of the present invention. Preferably, wire 1001 is connected to pad extension 801 which is preferably aligned with wire 1001. Pad extension 801 is preferably dimensioned to allow for variation in the length of and placement of wire 1001 and still permit secure attachment of wire 1001 to pad 800. Variation in the length of wire 1001 may be introduced by minor inconsistencies in the manufacturing process for wire 1001, and variation in the placement of wire 1001 may arise from the dimensional repeatability of robotic or other assembly equipment employed to place wire 1001 in contact with pad 800. Wire 1001 is preferably welded or ultrasonically bonded to pad 800.

Figure 11:
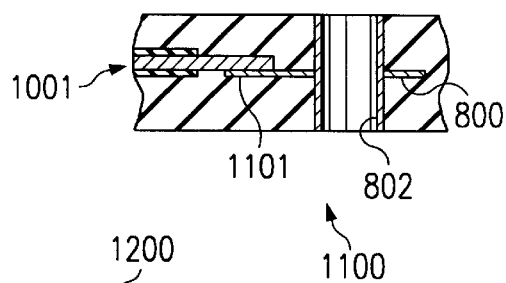
FIG. 11 is a side view of an attachment of a wire to the printed circuit board pad of FIG. 8 according to a preferred embodiment of the present invention.

FIG. 11 is a side view 1100 of an attachment of a wire 1001 to the printed circuit board pad of FIG. 8 according to a preferred embodiment of the present invention. Wire 1001 and pad 800 are preferably connected employing attachment region 1101. As mentioned in connection with FIG. 10, wire 1001 is preferably affixed to pad 800 employing methods including but not limited to welding and ultrasonic bonding.

In a preferred embodiment, a highly robust mechanical attachment is established between wire 1001 and pad 800 in attachment region 1101. This robust mechanical attachment preferably enables wire 1001 to maintain solid mechanical contact with pad 800 even when the flex circuit of which both are a part is flexed, causing wire 1001 to be pulled and moved in various directions.

In a preferred embodiment, in addition to the previously discussed robust mechanical attachment, the connection between wire 1001 and pad 800 preferably enables transmission of signals through attachment region 1101 without degradation of the high performance electrical properties of wire 1001. This is in contrast with the effects of employing connectors as practiced in the prior art which connectors commonly introduce impedance mismatches, crosstalk, and skew. Accordingly, attachment region 1101 preferably provides a combination of robust mechanical and electrical connection properties not simultaneously available in the prior art.

Figure 12:
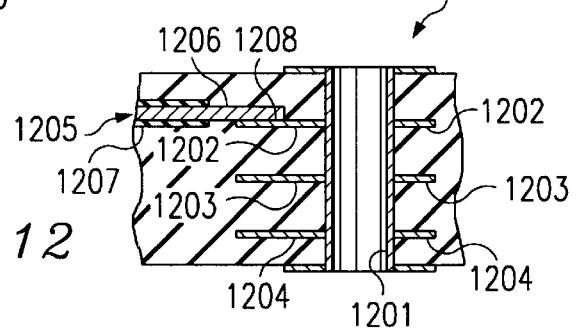
FIG. 12 is a section view of a wire connected to one of a set of pads connected to a via according to a preferred embodiment of the present invention.

FIG. 12 is a section view 1200 of a wire 1205 connected to one of a set of pads connected to a via 1201 according to preferred embodiment of the present invention. Pads 1202, 1203, and 1204 preferably surround via 1201 and are preferably in substantially continuous contact with via 1201 along the circumference of via 1201. Accordingly, a highly robust mechanical and electrical connection is preferably established between via 1201 and each of conductive pads 1202, 1203, and 1204.

In a preferred embodiment, wire 1205 generally corresponds to wire 1001 depicted in FIG. 11. Wire 1205 is preferably rigidly bonded to pad 1202 employing one of a plurality of mechanisms including but not limited to: ultrasonic bonding and welding. Wire 1205 preferably makes contact with pad 1202 along attachment regionl 208. Wire 1205 preferably includes inner conductive portion 1206 and an outside insulating layer 1207 which may be composed of polytetrafluoroethylene. Securely bonding wire 1205 to pad 1202 which is in turn rigidly bonded to plated via 1201 provides for an indirect connection of wire 1205 to via 1201 which indirect connection preferably boasts superior mechanical properties to those present in a direct wire to via connection of the prior art.

In a preferred embodiment, the advantage in mechanical robustness of the indirect attachment of wire 1205 to via 1201 is caused by both the secure bonding of wire 1206 to pad 1202 and by the traditionally robust attachment of pad 1202 to via 1201 owing to the substantially continuous circumferential contact between pad 1202 and via 1201.

In a preferred embodiment, a portion of a flex circuit such as that shown in FIG. 12 may be created employing the following steps. Layers of the flex circuit may be created by etching various conductive pads such as conductive pad 1202. A selection of pads may be disposed so as to be vertically aligned such as with pads 1202, 1203, and 1204. Pads 1202, 1203, and 1204 are preferably arranged such that one or more holes may be drilled through the pads and contact each of the pads at a desired location. Upon completing the drilling operation, plating material is preferably added to the drilled hole, thereby establishing robust mechanical and electrical connectivity between the plated hole or via 1201 and the pads 1202–1204 in communication with via 1201. Connection of wires to the pads, such as wire 1205 to pad 1202, may be accomplished prior to drilling the hole through pads 1202–1204 or after the drilling and plating of the hole and creation of via 1201.

In the prior art, conductive traces and pads were used together because the conductive pads were generally merely geometric enlargements of the traces which were employed as a mechanism for establishing conduction over a significant distance. Where traces were employed as a conduction mechanism for significant distances, discrete wires are generally not present since traces and wires would represent redundant functionality. Since wires and traces were generally not deployed in the same systems at the same time, little opportunity would arise to connect the two together.

In the prior art, discrete wires were generally employed in high speed data applications for which rigid circuit boards were employed. The problems of "wire pull" and movement of wires are generally not present in a rigid circuit environment. Accordingly, although the mechanical connection between discrete wires and vias was not robust in the rigid circuit board environment, potentially destructive events such as "wire pull" which might cause rupture of the wire-via connection generally did not occur.

Figure 13:
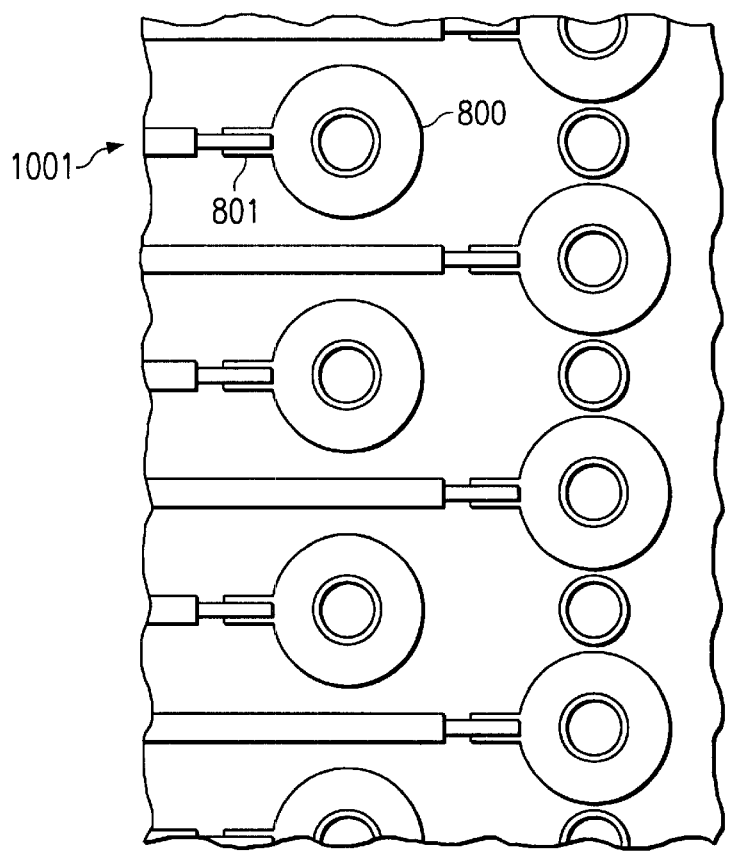
FIG. 13 depicts a pad pattern available using the inventive connection technology according to a preferred embodiment of the present invention.

FIG. 13 depicts a pad pattern 1300 available using the inventive connection technology according to a preferred embodiment of the present invention. It will be appreciated that numerous other arrangements of wires and pads are available, and all such variations are included within the scope of the present invention. One factor which may be varied in alternative embodiments is the angle formed between pad extension 801 and wire 1001 upon attachment of the two. For instance, there may be a 45 degree angle between the pad extension 801 and wire 1001. Other implementations include deployment of multi-row high-density connection patterns.

Figure 14:
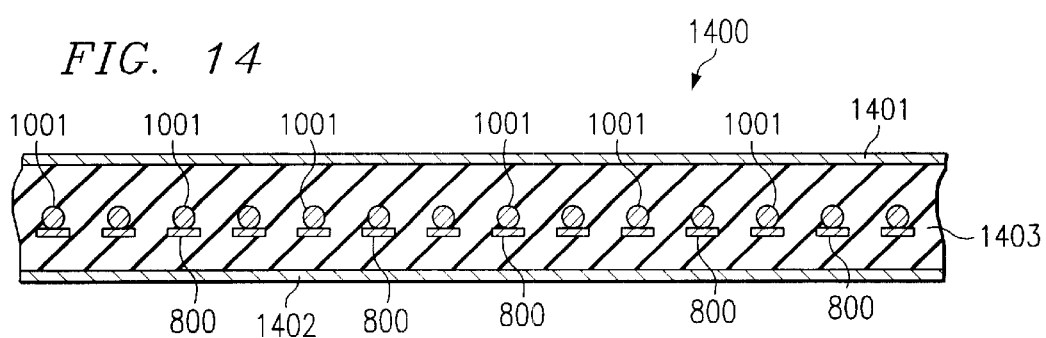
FIG. 14 is a section view of a plurality of inventive wire-to-pad connections according to a preferred embodiment of the present invention.
Figure 15:
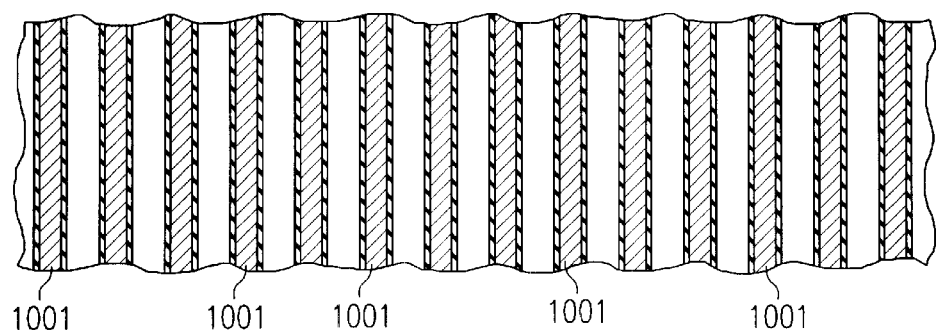
FIG. 15 is a top view of a center line cross section of a plurality of wires according to a preferred embodiment of the present invention.

FIG. 14 is a section view of a plurality 1400 of inventive wire-to-pad connections disposed within a flex circuit according to a preferred embodiment of the present invention. It may be seen that wire 1001 sits immediately above pad 800 to which it is preferably bonded employing a welded connection, ultrasonically bonded connection, or other secure attachment means. FIG. 15 is a top view 1500 of a center line cross section of the same plurality of wires depicted in the section view of FIG. 14. Although the wires shown in FIGS. 14 and 15 are shown running in parallel, it will be appreciated that the wires 1001 may be arranged in a range of different orientations and locations with respect to each other and that all such variations are included within the scope of the present invention.

In a preferred embodiment, the plurality of wires 1400 is disposed between two stripline shield layers 1401 and 1402. Flexible dielectric material 1403 is preferably disposed between pad 800 and lower stripline shield layer 1402, between wires 1400 and upper stripline shield layer 1401 and in regions in between the wires 1400 themselves.

In a preferred embodiment, the wires 1400 may be adhered to flexible dielectric material 1403 employing a thermosetting adhesive. It will be appreciated that other methods for adhering wires 1400 to dielectric material 1403 may be employed, and all such variations are within the scope of the present invention. The ends of wires 1400 are preferably affixed to pads 800 employing either welding or ultrasonic bonding as discussed in connection with FIG. 10 and elsewhere herein. Therefore, a flex circuit may be constructed which combines thermosetting adhesion of the wires along the majority of their length to a flexible dielectric and a secure ultrasonic bond or welded connection between the ends of wires 1400 and conductive pads 800. A flex circuit employing the described combination of connection mechanisms preferably enjoys the mechanical robustness arising from the described connection mechanisms as well as advantageous electrical characteristics arising from the deployment of discrete wires for conduction purposes. Moreover, stacking of various layers is available in the inventive discrete wired flex circuit as with traditional flex circuits.

Figure 16:
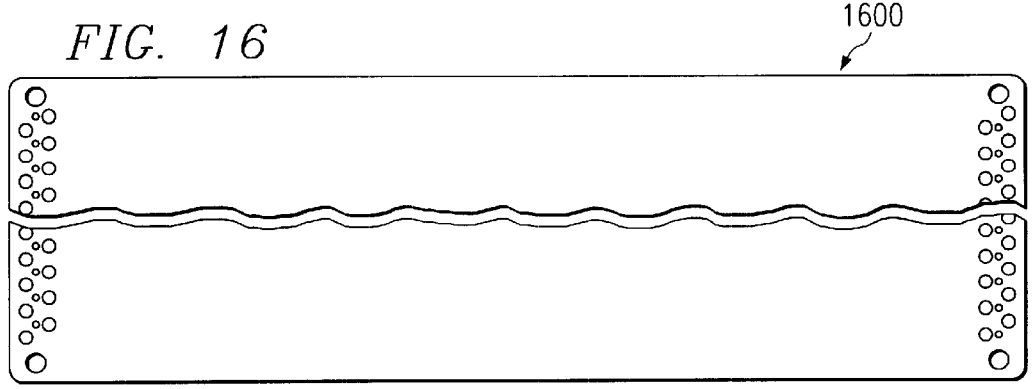
FIG. 16 is a top view of a ground shield layer for use in a flex circuit according to a preferred embodiment of the present invention.

FIG. 16 is a top view of a ground shield layer 1600 for use in a flex circuit according to a preferred embodiment of the present invention. One possible embodiment of shield layer 1600 is depicted as element 1401 in FIG. 14.

Figure 17:
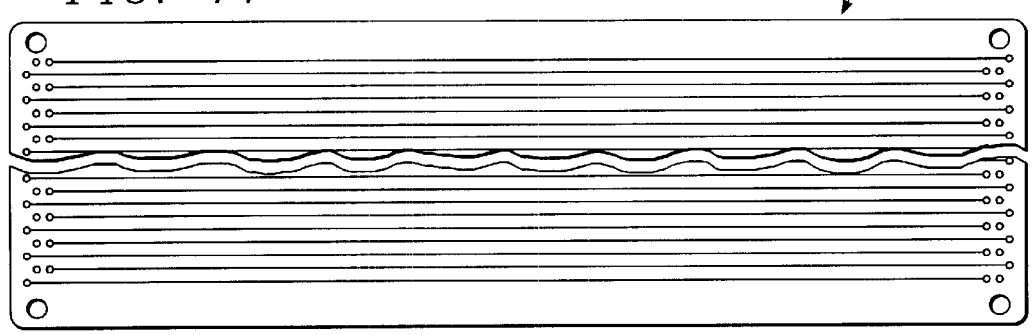
FIG. 17 is a top view of signal layer within a flex circuit according to a preferred embodiment of the present invention.

FIG. 17 is a top view of signal layer 1700 within a flex circuit according to a preferred embodiment of the present invention. One possible embodiment of signal layer 1700 is represented by the plurality of wires 1001 connected to pads 800 in a horizontal array as depicted in FIG. 14.

Figure 18:
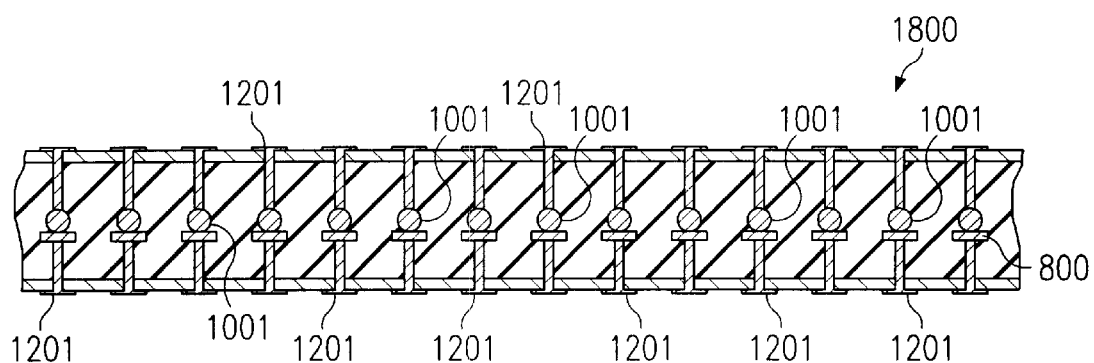
FIG. 18 depicts a section view of a flex circuit according to a preferred embodiment of the present invention.

FIG. 18 depicts a section view of a flex circuit 1800 according to a preferred embodiment of the present invention. Generally, each of the elements disposed vertically includes wire 1001 in contact with conductive pad 800. Also depicted is via 1201 generally having horizontal conductive portions at the upper and lower layers of flex circuit 1800 and a plated hole depicted as a solid black line running between the upper and lower layers of flex circuit 1800.

Figure 19:
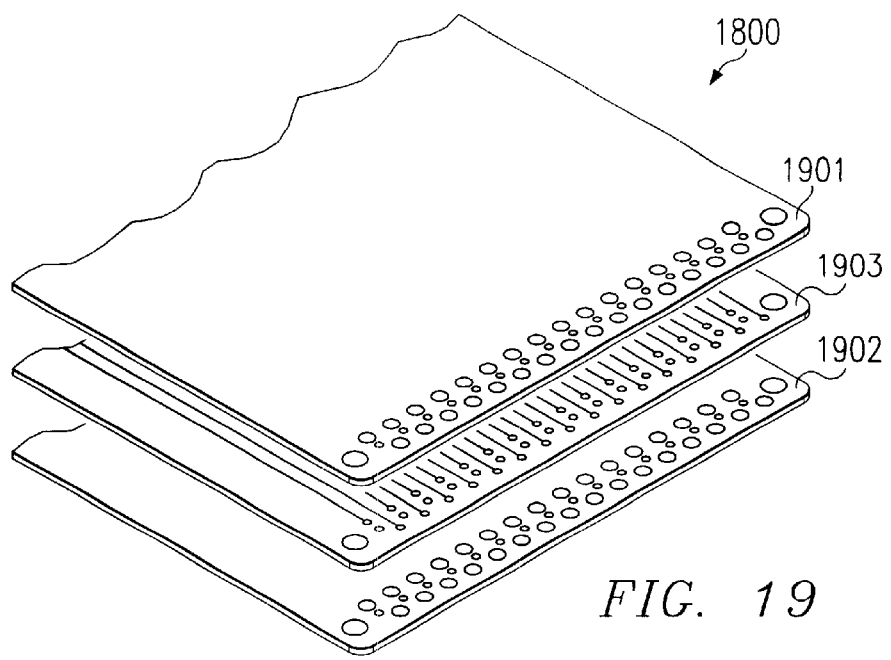
FIG. 19 depicts multiple layers composing a flex circuit according to a preferred embodiment of the present invention.

FIG. 19 depicts multiple layers composing a flex circuit 1800 according to a preferred embodiment of the present invention. Ground shield layers 1901 and 1902 generally correspond to ground shield layer 1600 depicted in FIG. 16 and generally form the upper and lower layers of flex circuit 1800. Signal layer 1903 generally corresponds to signal layer 1700 depicted in FIG. 17. Signal layer 1903 is generally disposed in between ground shield layers 1901 and 1902, thereby benefitting from the insulation provided by layers 1901 and 1902.

Figure 20:
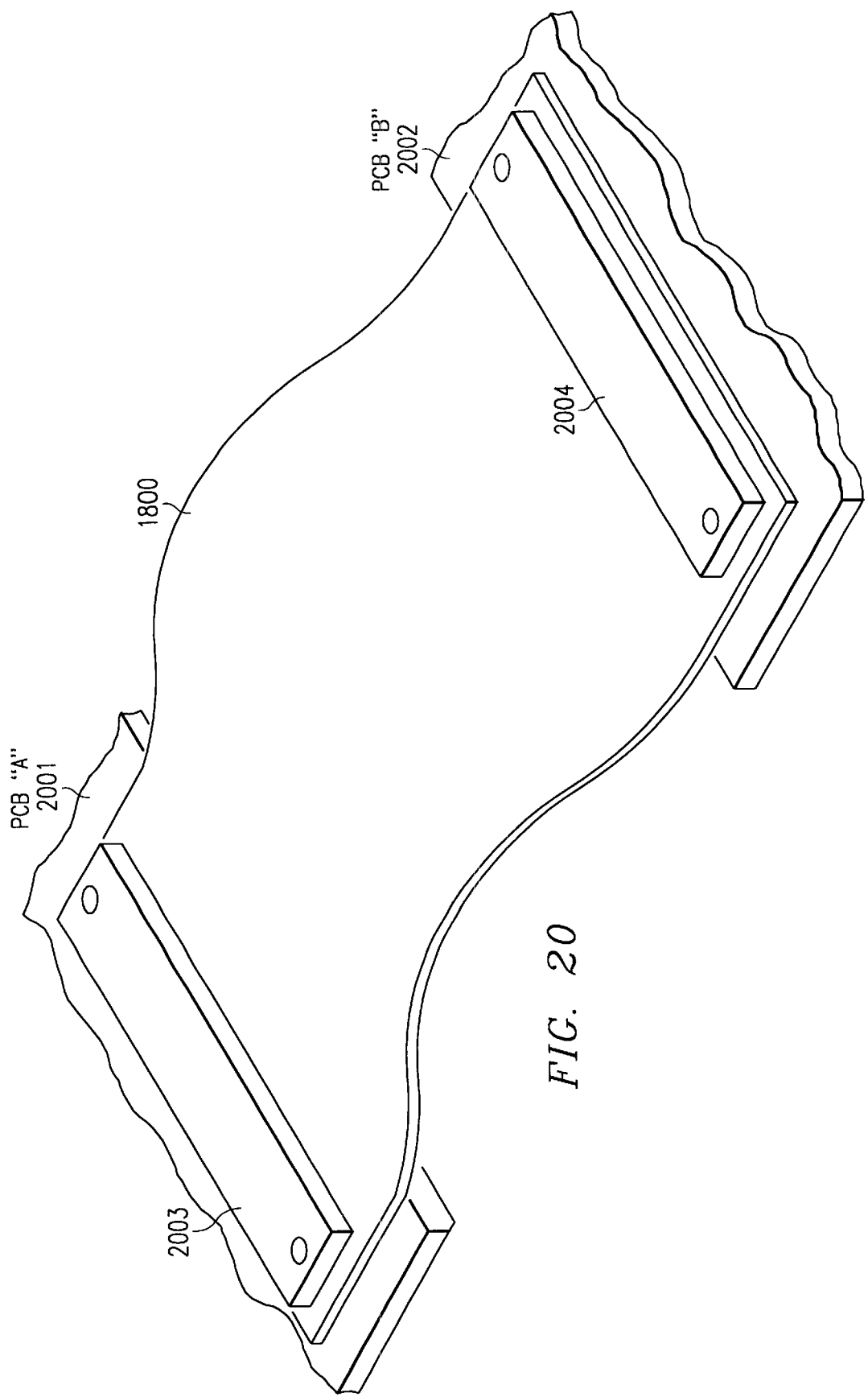
FIG. 20 depicts two printed circuit boards connected by a flex circuit according to a preferred embodiment of the present invention.

FIG. 20 depicts two printed circuit boards connected by flex circuit 1800 according to a preferred embodiment of the present invention. Flex circuit 1800 is shown attached at one end to PCB "A" employing attachment means 2003 and at a second end to PCB 2002 employing attachment means 2004. Attachment means 2003 and 2004 may include but are not limited to: attachment bolts, clips, clamps, mating pin and hole attachments, and socket connections.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. Apparatus for providing electrical signal transmission in a controlled impedance stripline flexible circuit assembly, the apparatus comprising:

a conductive pad;

a discrete conductor securely bonded to said conductive pad;

a plated via protruding through a thickness of said conductive pad;

a first stripline shield layer disposed above said discrete conductor; and a second stripline shield layer disposed below said discrete conductor.

2. The apparatus of claim 1 wherein said conductive pad comprises:

a pad extension for providing a region for bonding to said discrete conductor, wherein said pad extension is dimensioned to accommodate variation in a position of an end of said discrete conductor.

3. The apparatus of claim 1 wherein the discrete conductor is a round wire.

4. The apparatus of claim 1 wherein the discrete conductor is a round copper wire.

5. The apparatus of claim 1 wherein said discrete conductor is ultrasonically bonded to said conductive pad.

6. The apparatus of claim 1 wherein said discrete conductor is welded to said conductive pad.

7. The apparatus of claim 1 wherein said via extends through at least one additional pad in addition to said conductive pad, thereby establishing electrical contact between said at least one additional pad and said conductive pad.

8. A system for providing electrical and mechanical connections in a controlled impedance stripline flex circuit, the system comprising:

means for connecting a conductive pad to a via;

means for affixing a wire to said conductive pad;

means for optimizing a quality of electrical signal transmission along a length of said wire;

a first stripline shield layer disposed above said wire; and a second stripline shield layer disposed below said wire.

9. The system of claim 8 wherein said means for affixing comprises:

means for ultrasonically bonding said wire to said conductive pad.

10. The system of claim 8 wherein said means for affixing comprises:

means for welding said wire to said conductive pad.

11. The system of claim 8 wherein said means for optimizing a quality of electrical signal transmission comprises:

means for insulating said wire.

12. The system of claim 8 wherein said means for optimizing a quality of electrical signal transmission comprises:

means for affixing round copper wire to said conductive pad.

13. A controlled impedance stripline flex circuit having high performance electrical characteristics, the flex circuit comprising:

at least one conductive pad;

at least one discrete conductor securely bonded to at least one of said at least one conductive pad;

a via in secure mechanical and electrical contact with said at least one of said at least conductive pad;

flexible dielectric material disposed substantially throughout said flex circuit, wherein said at least one discrete conductor is bonded to said flexible dielectric material along a majority of a length of said at least one conductor;

a first stripline shield layer disposed above said at least one discrete conductor; and a second stripline shield layer disposed below said at least one discrete conductor, wherein said first stripline shield layer, said at least one discrete conductor bonded to said at least one of said at least one conductive pads, and said second stripline shield layer form a first circuit layer of said flex circuit.

14. The flex circuit of claim 13 further comprising:

at least one additional circuit layer in said flex circuit.

15. The flex circuit of claim 13 further comprising:

thermosetting adhesive for bonding said at least one discrete conductor to said flexible dielectric material.

16. The flex circuit of claim 13 wherein said at least one discrete conductor is ultrasonically bonded to said at least one conductive pad.

17. The flex circuit of claim 13 wherein said at least discrete conductor is welded to said at least one conductive pad.

18. The flex circuit of claim 13 wherein said at least one discrete conductor comprises:

at least one discrete round wire.

19. The flex circuit of claim 13 wherein said via extends entirely through said at least one conductive pad.

20. The flex circuit of claim 13 wherein said first circuit layer of said flex circuit comprises:

a plurality of straight discrete conductors disposed substantially parallel to one another and in substantially the same horizontal plane.

21. The flex circuit of claim 13 further comprising:

a plurality of discrete conductors disposed in a multiple row, high density connection pattern.

* * * * *